United States Patent [19]

Catalano

[11] Patent Number: 4,782,376
[45] Date of Patent: Nov. 1, 1988

[54] PHOTOVOLTAIC DEVICE WITH INCREASED OPEN CIRCUIT VOLTAGE

[75] Inventor: Anthony W. Catalano, Rushland, Pa.

[73] Assignee: General Electric Company, Fairfield, Conn.

[21] Appl. No.: 534,154

[22] Filed: Sep. 21, 1983

[51] Int. Cl.$^4$ .................... H01L 27/14; H01L 31/00
[52] U.S. Cl. ...................................................... 357/30
[58] Field of Search .......................................... 357/30

[56] References Cited

U.S. PATENT DOCUMENTS

| | | | |
|---|---|---|---|
| 4,064,521 | 12/1977 | Carlson | 357/2 |
| 4,109,271 | 8/1978 | Pankove | 357/30 |
| 4,379,943 | 4/1983 | Yang et al. | 136/249 |

FOREIGN PATENT DOCUMENTS

| | | | |
|---|---|---|---|
| 58-98988 | 6/1983 | Japan . | |
| 58-106876 | 6/1983 | Japan . | |
| 2111303 | 6/1983 | United Kingdom | 357/30 |

OTHER PUBLICATIONS

K. Homma et al., "Technique for Improving the Conversion Efficiency of Thin-Film Amorphous Semiconductor Solar Cells", Tokyo Electrical Engineering College Technical Report No. 29, Dec. 1981 (Translation).

Scott et al., "Glow Discharge Preparation of Amorphous Hydrogenated Silicon From Higher Silanes", Applied Physics Letters 37, 725 (1980).

Ogawa et al., "Preparation of a-Si:H from Higher Silanes ($Si_nH_{2n+2}$)", Japanese Journal of Applied Physics 20, L639 (1981).

Primary Examiner—William L. Sikes
Assistant Examiner—Robert E. Wise
Attorney, Agent, or Firm—T. H. Magee

[57] ABSTRACT

A photovoltaic device having an increased open circuit voltage includes a body of semiconductor material between layers of opposite conductivity type, one of which has a wide bandgap energy and through which light enters the device. The body includes a first region closest to the wide bandgap layer and a second region with the bandgap energy of the first region being greater than that of the second region and less than or equal to that of the wide bandgap layer.

12 Claims, 1 Drawing Sheet

PHOTOVOLTAIC DEVICE WITH INCREASED OPEN CIRCUIT VOLTAGE

The invention relates to a P-I-N photovoltaic device, preferably containing amorphous silicon and hydrogen, which has an increased open circuit voltage.

BACKGROUND OF THE INVENTION

A P-I-N photovoltaic device typically comprises a layer of P-type conductivity semiconductor material, a layer of substantially intrinsic (I-type) conductivity semiconductor material and a layer of N-type conductivity semiconductor material with electrical contacts being made to the P and N-type conductivity layers. Carlson, in U.S. Pat. No. 4,064,521, incorporated herein by reference, has disclosed photovoltaic devices, including P-I-N devices, fabricated in a glow discharge containing silane ($SiH_4$). The deposited material, comprising hydrogenated amorphous silicon (a-Si:H), exhibits an energy bandgap of about 1.7 electron volts (eV), depending upon the deposition conditions. Pankove in U.S. Pat. No. 4,109,271, incorporated herein by reference, has disclosed the use of a wide bandgap hydrogenated amorphous silicon carbon alloy (a-SiC) in the doped layer through which light enters the device. The bandgap of the a-SiC alloy varies between about 1.7 and 3.2 eV depending upon the alloy composition.

The efficiency of these devices for the generation of electrical power depends upon the current collection and the open circuit voltage ($V_{oc}$). Current collection has been improved using light-trapping techniques and by providing an I-type layer whose bandgap energy decreases with distance from the light-entry surface. The decreasing bandgap energy provides both an internal electric field which enhances the collection of charge carriers and an increased absorption of the incident light. An increase in $V_{oc}$ has been observed when an a-SiC:H alloy is used in place of a-Si:H for the P-type layer through which light enters the device. Further increases in the voltage output are possible using a tandem arrangement of individual cells. However, it would still be desirable to improve the performance of the individual cells by changes in their structure or the materials used to fabricate the devices.

SUMMARY OF THE INVENTION

The invention is a photovoltaic device comprising a body of semiconductor material between a wide bandgap energy first layer of first conductivity type through which light enters the device and a second layer having the opposite conductivity type to that of the first layer. The body of semiconductor material includes a first region closest to the first layer having an energy bandgap equal to or less than that of the first layer and a second region having substantially intrinsic conductivity type and an energy bandgap less than that of the first region. This device exhibits an increased $V_{oc}$ compared to that of devices in which the first region of the body is not present.

DETAILED DESCRIPTION OF PREFERRED EMBODIMENTS

Figure 1:
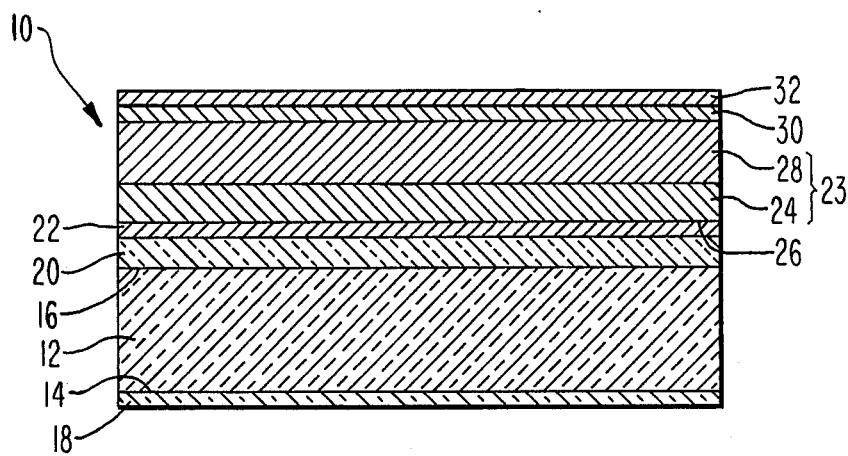
FIGS. 1 and 2 are a cross-sectional views of two different embodiments of the photovoltaic device of the invention.

In FIG. 1 the photovoltaic device 10 includes a substrate 12 having first and second major surfaces 14 and 16. An anti-reflection coating 18 through which light enters the device 10 overlies the first major surface 14. A light-transmissive, electrically conducting layer 20 overlies the second major surface 16. A first wide bandgap semiconductor layer 22 of first conductivity type, typically P-type, overlies the electrically conducting layer 20. A second semiconductor layer 23 overlies the wide bandgap layer 22. The second semiconducting layer 23 includes a first region 24 which has a bandgap energy no greater than that of the wide bandgap layer 22 and which overlies the wide bandgap layer 22. The first region 24 may have substantially intrinsic conductivity type or preferably, it has the opposite conductivity type to that of the first layer 22 so that a P-N junction 26 is formed at the interface between the wide bandgap 22 and the first region 24. A second region 28 of the second semiconductor layer 23, having substantially intrinsic conductivity type and a bandgap less than that of the first region 24, overlies the first region 24. A third layer 30 of second conductivity type, having the opposite conductivity type to that of the wide bandgap layer 22, overlies the second layer 23 and an electrical contact 32 overlies the third layer 30.

Figure 2:
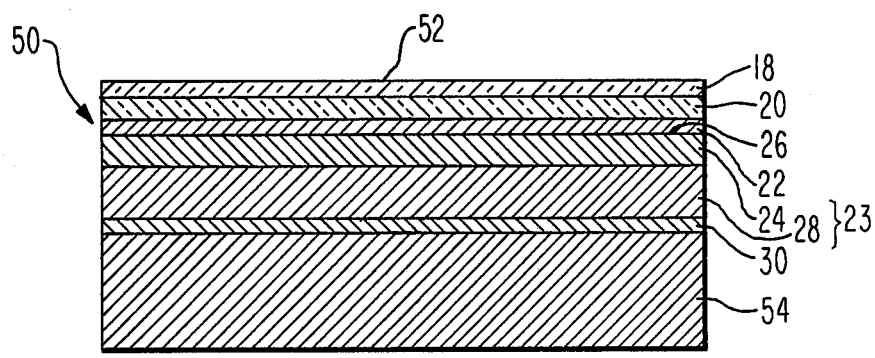

The numerical identification of the elements of the photovoltaic device 50 of FIG. 2 and the photovoltaic device 10 of FIG. 1 which have the same function and properties is the same. The photovoltaic device 50 differs from the photovoltaic device 10 of FIG. 1 in that light enters the device in the opposite direction through the surface 52 of the anti-reflection coating 18 so that the order of the layers on the substrate 52 is reversed. The third layer 30 of second conductivity type overlies a surface of the substrate 54 which provides the electrical contact to the layer 30. Alternatively, a separate electrically conducting layer may be interposed between the third layer 30 and the substrate 54. The second semiconductor layer 23, comprising the first and second regions 24 and 28, respectively, overlies the third layer 30. The wide bandgap semiconductor layer 22 overlies the second semiconductor layer 23. Preferably a P-N junction is formed at the interface between the wide bandgap layer 22 and the first region 24 of the second semiconductor layer 23. A light-transmissive, electrically conducting layer 20 overlies the wide bandgap semiconducting layer 22 and the anti-reflection coating 18 overlies the light-transmissive, electrically conducting layer 20.

The substrate 12 is composed of a light-transmissive material, such as glass, having sufficient strength to support the remainder of the structure. The substrate 54 need not be light-transmissive and is preferably composed of a material which has sufficient electrical conductivity to provide an electrical contact to the third layer 30.

The anti-reflection coating 18 is typically a single light-transmissive layer of a material, such as $MgF_2$, having an optical thickness of about one-half wavelength in the visible portion of the wavelength spectrum to provide broad-band, low reflectivity. This layer may be formed using well-known vacuum- or chemical-deposition techniques.

The light-transmissive, electrically conducting layer 20 through which light enters the photovoltaic devices 10 and 50 is substantially transparent over the wavelength range of between about 400 and 1,000 nm and is typically composed of a transparent conductive oxide such as indium-tin oxide or of a thin metal layer. Alternatively the functions of the light-transmissive substrate 12 and light-transmissive, electrically conducting layer 20 of the device 10 may be combined into one substantially transparent and electrically conductive layer.

The wide bandgap energy semiconductor layer 22 through which light enters the device is typically between about 5 and 50 nm thick and is composed of a material which has a bandgap energy of about 1.7 electron volts (eV) or greater. This layer typically contains a conductivity-modifying dopant in an atomic concentration of about $10^{21}/cm^3$. If this layer is P-type conducting, it is preferably composed of a doped a-SiC:H alloy in which the ratio of C to Si is between about 0.1 and about 1. If this layer is N-type conducting, it may be composed of an a-SiC:H alloy or a a-SiN:H alloy in which the ratio of N to Si is between about 0.1 and 1. The a-SiC and a-SiN alloys may be deposited using the method disclosed by Pankove in U.S. Pat. No. 4,109,271, incorporated herein by reference. Alternatively, this layer may be composed of a-Si containing a halogen or an excess amount of hydrogen compared to that normally incorporated into the a-Si. The hydrogen-containing a-Si layers may be sequentially deposited using the method disclosed in U.S. Pat. No. 4,064,521.

The first semiconductor region 24 is typically between 10 and 350 nm thick and preferably about 200 nm thick. This region has an energy bandgap which is less than or equal to that of the wide bandgap layer 22 and greater than that of the second region 28 and which is preferably substantially constant throughout the thickness of the region. The bandgap energy is greater than 1.7 eV and preferably between about 1.7 and 2.0 eV. This region may have substantially intrinsic-type conductivity which includes undoped, compensated or slightly N-type or P-type conducting material. Alternatively it may be the opposite conductivity type to that of the wide bandgap semiconductor layer 22 to ensure that the P-N junction occurs at the interface 26 between the wide bandgap layer and the first region 24. The device thus formed is then a P-N-I-N or N-P-I-P device. This region may be composed of the same alloys as the wide bandgap layer 22 or other compositions of the same materials having smaller energy bandgaps. Any wide bandgap energy material having sufficiently long minority carrier lifetime, typically greater than $10^{-6}$ seconds, is useful.

Alternatively, the first region may be composed of a-Si containing an amount of hydrogen sufficient to increase its bandgap energy to a value greater than about 1.7 eV. Typically a-Si deposited in a glow discharge from an atmosphere containing SiH4 at a substrate temperature of about 240° C. contains about 10% hydrogen. The hydrogen content can be increased by decreasing the substrate temperature or, for example, by depositing the layer in a glow discharge containing a higher silane ($Si_nH_{2n+2}$) such as disilane ($Si_2H_6$) at a substrate temperature of about 240° C. A hydrogen content of about 20 percent in a-Si produced by this method has a bandgap energy of about 1.85 eV. This bandgap energy value may be varied by varying the substrate temperature, the molecular weight of the silane, the gas flow rate and the electrical power dissipation in the discharge.

The second region 28 of the second semiconductor layer 23 is typically between about 100 and 600 nm thick and preferably about 400 nm thick. The second region 28 has a bandgap energy which is less than that of the first region 24 and which is either constant or varying with thickness. This region has substantially intrinsic conductivity type which includes undoped, compensated and slightly N-type or P-type conducting material and is composed of a material such as a-Si containing hydrogen and/or a halogen which has a bandgap of about 1.7 eV or less. Alternatively the second region 28 may be composed of an alloy of amorphous material containing Si and a spatially varying concentration of a second element such as Ge or Sn to provide a decreasing bandgap energy with distance from the first region.

Typically the third layer 30 is between about 5 and 50 nm thick and is composed of an amorphous silicon semiconductor material. Typically the third layer 30 has the same bandgap energy as the adjacent portion of the second layer 23. This layer has the opposite conductivity type to the wide bandgap layer 22 and typically contains a conductivity-modifying dopant having an atomic concentration of about $10^{21}/cm^3$.

The electrical contact 32 is typically composed of a metal which will make a ohmic contact to the third layer 30. Typically this layer is composed of a layer of titanium and a layer of aluminum sequentially deposited by vacuum-evaporation or sputtering techniques.

It is to be understood that a-Si having a bandgap energy of about 1.7 contains hydrogen in a concentration between about 5 and 20 atomic percent and typically about 10 atomic percent. a-Si having a bandgap energy greater than 1.7 eV contain more than 15 atomic percent of hydrogen with the bandgap energy increasing with increasing hydrogen concentration. These materials may also contain a halogen ion such as fluorine, chlorine, bromine or iodine.

The utility of the photovoltaic devices of the invention lies in the fact that $V_{oc}$ is increased without sacrificing the current collection efficiency or the overall device efficiency. Devices with higher $V_{oc}$ may be possible by increasing the bandgap of the I-type layer but this would cause a significant reduction in the absorption near the peak of the solar spectrum with a resultant decrease in the short circuit current $J_{sc}$. I have found that higher open circuit voltages can be obtained by making the first region 24 closest to the light-entry surface, and, preferably closest to the P-N junction, of a material having a bandgap energy of at least about 1.7 eV and preferably between 1.7 and 2.0 eV and a second region 28 of the semiconducting layer 23 having a smaller bandgap energy, preferably about 1.7 eV or less. A bandgap energy of 1.7 eV or less for the second region ensures that light near the peak of the solar flux, and to longer wavelengths, is efficiently absorbed.

The relative thicknesses of the first and second regions 24 and 28 of the second layer 23 as well as the total thickness of the second layer 23 are also important. For optimum efficiency the total thickness of the second layer 23 should be comparable to the collection length for photogenerated carriers. The optimum total thickness depends upon the quality of the different materials comprising the second layer 23. Typically in present-day a-Si:H and alloys of this material with other elements this thickness is between about 500 and 800 nm and typically about 600 nm.

The first region 24 of the second layer 23 should be thick enough to encompass a large fraction, preferably at least 50 percent, or all of the space-charge region adjacent to the P-N junction 26 while the second region 28 should have a thickness sufficient to provide absorption of the light near the peak of the solar spectrum. The thickness of the first region 24 is always less than the thickness of the second region 28. I have found that the optimum compromise for a 600 nm thick layer of a-Si to produce the maximum $V_{oc}$ while maintaining the current collection efficiency is a thickness of about 200 nm for the first region 24 and a thickness of about 400 nm for the second region 28.

The invention is illustrated by the following Example but it is not intended to be limited to the details therein.

EXAMPLE

Reference photovoltaic devices were fabricated by deposition from a glow discharge in $SiH_4$ containing the appropriate dopants. These devices comprised a $SnO_2$ layer on a glass substrate, a 12 nm thick $Si_{0.5}C_{0.5}$ P-type layer having a 2.0 eV bandgap formed in a glow discharge containing $SiH_4$, $CH_4$ and $B_2H_6$, a 580 nm thick a-Si I-type layer having an about 1.68 eV bandgap formed in a glow discharge containing $SiH_4$, a 50 nm thick N-type layer of a-Si formed in a glow discharge containing $SiH_4$ and $PH_3$ and a Ti-Al electrical contact deposited by sputtering. The best of these devices had a $V_{oc}=0.82$ volts and a $J_{sc}=12.9$ milliamperes under AM-1 illumination.

Photovoltaic devices of the invention were fabricated by depositing the layers onto the same type of $SnO_2$ electrically conducting layers as used for the reference devices. These layers comprise a 12 nm thick P-type layer of a-$Si_{0.5}C_{0.5}$ having a 2 eV bandgap as for the reference sample, a 200 nm thick first I-type layer having a bandgap of about 1.85 eV formed in a dc glow discharge containing $Si_2H_6$ at a substrate temperature of 240° C., a 380 nm thick second I-type layer of a-Si having a 1.68 eV bandgap formed in a glow discharge containing $SiH_4$, a 50 nm thick N-type layer of a-Si as for the reference sample and a Ti-Al electrical contact deposited by sputtering. The best of these devices had a $V_{oc}=0.924$ eV and a $J_{sc}=9.97$ milliamperes under AM-1 illumination.

The use of a first I-type layer having a wider bandgap energy than the remainder of the I-type layer thus produced a better than 10% increase in $V_{oc}$. The lower $J_{sc}$ is believed to be due to the quality of the $Si_2H_6$ starting material and the fact that the optimum growth conditions for the first I-type layer in $Si_2H_6$ have not been determined.

I claim:

1. In a photovoltaic device comprising a body of semiconductor material between a first wide bandgap energy layer of first conductivity type through which light enters the device and a second layer having a second conductivity type opposite to that of the first layer, the improvement which comprises:

the body of semiconductor material comprising a first region which is closest to the first layer and a second region having substantially intrinsic type conductivity wherein the bandgap energy of the first region is constant and is greater than that of the second region and no greater than that of the first layer, the bandgap energy of the second region is less than or equal to about 1.7 electron volts and the thickness of the first region is less than that of the second region.

2. The device of claim 1 wherein there is a P-N junction at the interface between the first region and the wide bandgap energy layer.

3. The device of claim 2 wherein the bandgap energy of the first region is equal to that of the first layer.

4. The device of claim 3 wherein the bandgap energy of the second region decreases with increasing distance from the first region.

5. The device of claim 2 wherein the bandgap energy of the first region is less than the bandgap energy of the first layer.

6. The device of claim 5 wherein the bandgap energy of the first region is between about 1.7 and 2.0 electron volts.

7. The device of claim 5 wherein the bandgap energy of the second region is constant.

8. The device of claim 5 wherein the bandgap energy of the second region decreases with increasing distance from the first region.

9. The device of claim 2 wherein the first layer has P-type conductivity, the first region has N-type conductivity, the second region has substantially intrinsic-type conductivity, and the second layer has N-type conductivity.

10. The device of claim 2 wherein the first semiconductor layer is amorphous and includes silicon and an element selected from the group consisting of carbon, nitrogen and oxygen, the first region is amorphous and includes silicon containing a greater amount of hydrogen than the second region, and the second region and the second layer are amorphous and include silicon and hydrogen.

11. The device of claim 2 wherein the first semiconductor layer is amorphous and includes silicon and an element selected from a group consisting of carbon, nitrogen and oxygen, and the first region includes amorphous silicon and an element selected from the group consisting of carbon, nitrogen and oxygen.

12. The device of claim 1 wherein the first layer has P-type conductivity, the first and second regions have substantially intrinsic type conductivity, and said second layer has N-type conductivity.

* * * * *